United States Patent
Jaiswal et al.

(10) Patent No.: US 10,515,679 B2
(45) Date of Patent: Dec. 24, 2019

(54) MAGNETO-RESISTIVE MEMORY STRUCTURES WITH IMPROVED SENSING, AND ASSOCIATED SENSING METHODS

(71) Applicant: GLOBALFOUNDRIES, Inc., Grand Cayman (KY)

(72) Inventors: Akhilesh Jaiswal, Malta, NY (US); Ajey P. Jacob, Malta, NY (US); Bipul C. Paul, Malta, NY (US); William Taylor, Malta, NY (US); Danny Pak-Chum Shum, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/889,369

(22) Filed: Feb. 6, 2018

(65) Prior Publication Data
US 2019/0244650 A1    Aug. 8, 2019

(51) Int. Cl.
*G11C 11/00* (2006.01)
*G11C 11/16* (2006.01)
(Continued)

(52) U.S. Cl.
CPC ........ *G11C 11/1673* (2013.01); *G11C 11/161* (2013.01); *H01L 27/228* (2013.01); *H01L 43/08* (2013.01)

(58) Field of Classification Search
CPC ... G11C 11/1673; G11C 11/161; H01L 43/08; H01L 27/228
(Continued)

(56) References Cited

U.S. PATENT DOCUMENTS 7,161,861 B2    1/2007  Gogl et al.
7,936,583 B2 *  5/2011  Khoury ............... G11C 11/1675
                                                           365/148
(Continued)

FOREIGN PATENT DOCUMENTS

CN        103811073 B      6/2016

OTHER PUBLICATIONS

Noguchi et al., "A-250-MHz 256b-I/O 1-Mb STT-MRAM with Advanced Perpendicular MTJ based Dual Cell for Nonvolatile Magnetic Caches to Reduce Active Power of Processors", Symposium on VLSI Circuits Digest of Technical Papers, 2013, two pages.
(Continued)

*Primary Examiner* — Tha-O H Bui
(74) *Attorney, Agent, or Firm* — Yee Tze Lim; Hoffman Warnick LLC (57) ABSTRACT

A magneto-resistive memory (MRM) structure includes a source line and a first transistor that includes a source region and a drain region. The source line is electrically connected to the source region of the first transistor. The MRM structure further includes an MRM cell that includes an MRM transistor electrically in series with an MRM magnetic tunnel junction (MTJ). The MRM transistor is electrically connected to the drain region of the first transistor such that the MRM cell is electrically in series with the first transistor. Still further, the MRM structure further includes a voltage amplifier electrically connected to a mid-point node of the first transistor and the MRM transistor, a sense-amplifier electrically connected to the voltage amplifier, and a bit line electrically connected to the MRM MTJ of the MRM cell.

20 Claims, 5 Drawing Sheets

(51) Int. Cl.
*H01L 27/22* (2006.01)
*H01L 43/08* (2006.01)

(58) Field of Classification Search
USPC .................................................. 365/148, 158
See application file for complete search history.

(56) References Cited

U.S. PATENT DOCUMENTS

| | | | |
|---|---|---|---|
| 9,373,383 B2 * | 6/2016 | DeBrosse | ........... G11C 11/1693 |
| 9,734,881 B2 | 8/2017 | Naik et al. | |
| 9,865,342 B2 | 1/2018 | Lee | |
| 2016/0064452 A1 * | 3/2016 | Ueda | ..................... H01L 27/228 |
| | | | 365/148 |
| 2016/0093352 A1 | 3/2016 | Jung et al. | |
| 2017/0271002 A1 | 9/2017 | Sakhare | |

OTHER PUBLICATIONS

Noguchi et al., "Highly Reliable and Low-Power Nonvolatile Cache Memory with Advanced Perpendicular STT-MRAM for High-Performance CPU", Symposium on VLSI Circuits Digest of Technical Papers, IEEE, 2014, two pages.
Ryu, Jang-Woo et al., "A Self Reference Sensing for Improving Reliability and Bandwidth with 2T2MTJ STT-MRAM Cell", Non-Volatile Memory Technology Symposium (NVMTS), 16th, IEEE, 2016, four pages.
German Patent and Trademark Office, Office Action for German Application No. 10 2018 206 813.5 dated Feb. 4, 2019.

* cited by examiner

MAGNETO-RESISTIVE MEMORY STRUCTURES WITH IMPROVED SENSING, AND ASSOCIATED SENSING METHODS

TECHNICAL FIELD

The present disclosure generally relates to magneto-resistive memory (MRM) structures for use in integrated circuits, and to methods of using such MRM structures. More particularly, the present disclosure relates to MRM structures with improved sensing at low read voltages, and to associated sensing methods.

BACKGROUND

MRM is an attractive memory technology, offering non-volatility, high performance, and high endurance. MRM structures include, for example, spin torque-transfer magneto-resistive random access memory (STT-MRAM), voltage-controlled magnetic anisotropy magneto-resistive random access memory (VCMA-MRAM), and spin orbit torque magneto-resistive random access memory (SOT-MRAM), among others known in the art. Regardless of the specific type, and with reference to FIG. 1, an MRM cell 100 includes an MRM magnetic tunnel junction (MTJ) 101 in series with an MRM field effect transistor (FET) 102 (hereinafter MRM transistor 103). The MRM MTJ 101 includes a magnetic fixed or pinned layer 111, which is a permanent magnet set to a particular polarity, a magnetic free layer 112, which has a changeable polarity, and tunnel barrier layer 113 separating the fixed layer 111 and the free layer 112. When the MRM MTJ 101 is in a parallel state (both layers 111 and 112 having the same polarity), the MRM cell 100 indicates a logic zero (0). When the MRM MTJ 101 is in an anti-parallel state (layers 111 and 112 having opposite polarity), the MRM cell 100 indicates a logic one (1). The MRM transistor 102 includes a semiconductor substrate 121, ion-doped MRM source and drain regions 122, 123 disposed in the substrate 121, and a conductive gate electrode 124 overlying the substrate 121 between the MRM source and drain regions 122, 123. A control voltage applied to the gate electrode 124 controls the flow of current through an underlying channel 125 between the MRM source and drain regions 122, 123.

Figure 1:
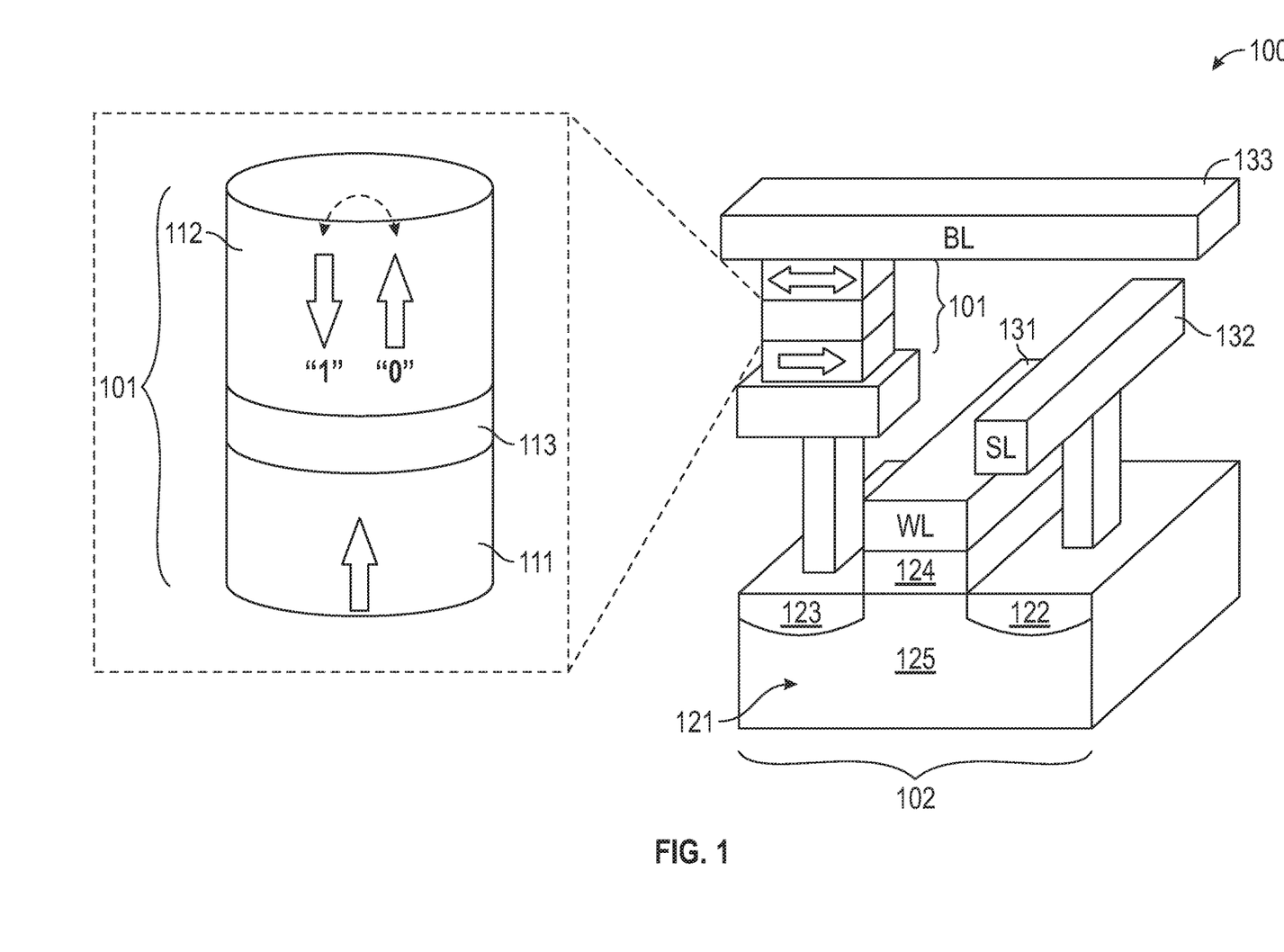
FIG. 1 is a structural illustration of a conventional MRM cell.

The control voltage is applied to the gate electrode 124 by a word line (WL) 131. A source line (SL) 132 is electrically connected to the MRM source region 122. A bit line (BL) 133 is electrically connected to the MRM MTJ 101, which in turn is electrically connected to the MRM drain region 123. In a memory array on an integrated circuit, the SL 132 may be so connected to a plurality of MRM transistors 102, and the BL 133 may be so connected to a plurality of MRM MTJs 101. One memory cell 100 along the BL 133 is selected by turning on its WL 131. When a relatively large voltage (e.g., about 400 mV or greater) is forced across the cell 100 from BL 133 to SL 132, the selected cell's MTJ 101 is written into a particular state, which is determined by the polarity of this voltage (BL 133 high vs. SL 132 high). When the cell 100 is in the logic zero (0) or parallel state, its MTJ resistance ($R_0$) is lower than when the cell 100 is in the logic one (1) or antiparallel state ($R_1$). A selected cell 100 may be read by sensing the resistance from BL 133 to SL 132. The "sense" or "read" voltage may be, in some devices, lower than the write voltage in order to distinguish write and read operations, and to avoid inadvertently disturbing the cell 100 during a read operation, although it need not be lower in other devices. However, random device variations (e.g., dimensions and other parameters) may lead to corresponding variations in $R_0$ and $R_1$. Thus, for some MRM MTJs 101, the actual distributions of $R_0$ and $R_1$ for a particular device may in practice overlap. In this case, it may be difficult to accurately read the state of the memory cell 100.

Accordingly, it is desirable to provide MRM structures with improved sensing at low read voltages, and associated sensing methods. Furthermore, other desirable features and characteristics of the present disclosure will become apparent from the subsequent detailed description and the appended claims, taken in conjunction with the accompanying drawings and the foregoing technical field and background.

BRIEF SUMMARY

In one exemplary embodiment, a magneto-resistive memory structure includes a source line and a first transistor that includes a source region and a drain region. The source line is electrically connected to the source region of the first transistor. The MRM structure further includes an MRM cell that includes an MRM transistor electrically in series with an MRM magnetic tunnel junction. The MRM transistor is electrically connected to the drain region of the first transistor such that the MRM cell is electrically in series with the first transistor. Still further, the MRM structure further includes a voltage amplifier electrically connected to a mid-point node of the first transistor and the MRM transistor, a sense-amplifier electrically connected to the voltage amplifier, and a bit line electrically connected to the MRM MTJ of the MRM cell.

In another exemplary embodiment, a magneto-resistive memory structure includes a source line and a first transistor that includes a source region and a drain region. The source line is electrically connected to the source region of the first transistor. The MRM structure further includes a reference magnetic tunnel junction electrically in series with the first transistor. The reference MTJ is electrically connected to the drain region of the first transistor. The MRM structure further includes an MRM cell that includes an MRM transistor electrically in series with an MRM MTJ. The MRM transistor is electrically connected to the reference MTJ such that the MRM cell is electrically in series with the first transistor and the reference MTJ. Still further, the MRM structure includes a voltage amplifier electrically connected to a mid-point node of the first transistor and the MRM transistor, a sense-amplifier electrically connected to the voltage amplifier, and a bit line electrically connected to the MRM MTJ of the MRM cell.

In yet another exemplary embodiment, a method for sensing a memory state of a magneto-resistive memory structure includes the step of generating a voltage across the MRM structure. The MRM structure includes a first transistor electrically in series with an MRM cell. The MRM cell includes an MRM transistor and an MRM magnetic tunnel junction. A mid-point voltage is thereby generated at a mid-point node between the first transistor and the MRM cell. The method further includes the steps of amplifying the mid-point voltage to generate an amplified voltage and sensing the amplified voltage to determine the memory state of the MRM structure. The present recitation of method steps is not intended to exclude other, non-recited steps as may be appropriate in an embodiment.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are generally directed to MRM structures with improved sensing at low read voltages, and to associated sensing methods. In the disclosed embodiments, a resistive series voltage divider is created by placing a transistor, or a transistor and a reference MTJ, between the source line and an MRM cell (or an array of MRM cells). The resistive series voltage divider divides the read voltage applied across the bit line and source line, with a first voltage across the transistor and a second voltage across the MRM cell summing to the read voltage. For a given read voltage, the relative magnitude of the first and second voltages will be different, depending on whether the MRM cell is at $R_0$ or $R_1$, as voltage is proportional to resistance. It is thus possible to sense the voltage at a mid-point node (i.e., between the transistor and the MRM cell) to determine the state of the MRM cell. At low read voltages, the difference in voltage at the mid-point node when the MRM cell is at $R_0$ compared to $R_1$ may likewise be small. Thus, in the disclosed embodiments, a voltage amplifier is employed to amplify the mid-point node voltage prior to sensing, thereby creating a larger difference in voltage when the MRM cell is at $R_0$ compared to $R_1$ that is able to be sensed more accurately.

The disclosed MRM structure, including the MRM cell (or array of MRM cells), may form part of an integrated circuit, which may also include other memory structures, in addition to logic and other structures, for example. For the sake of brevity, conventional techniques related to integrated circuit device fabrication are not described in detail herein. Various steps in the manufacture of semiconductor-based transistors are well-known and so, in the interest of brevity, many conventional steps will only be mentioned briefly herein or will be omitted entirely without providing the well-known process details. Thus, the various tasks and process steps of integrated circuit fabrication are omitted as being within the level of ordinary skill in the art.

Figure 2A:
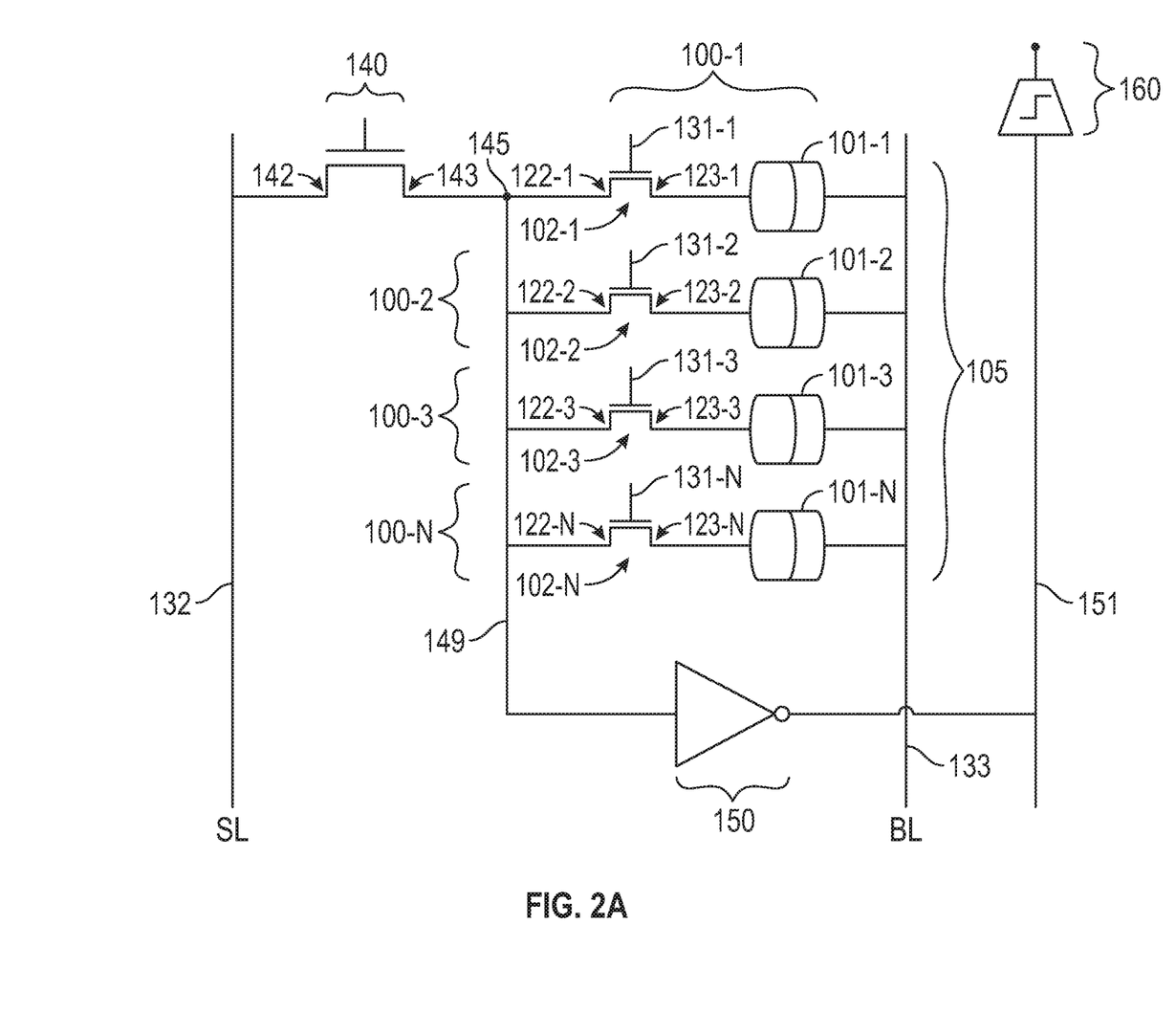
FIG. 2A is a design for an MRM structure in accordance with one embodiment of the present disclosure.

FIG. 2A presents a design for an MRM structure in accordance with one embodiment of the present disclosure. The disclosed MRM structure includes source line 132 and a "first" transistor 140 that includes a source region 142 and a drain region 143. The adjective "first" is used herein in the sense that the "first" transistor 140 is placed in immediate electrical connection with source line 132, that is, between source line 132 and any MRM transistor 102 of a memory cell 100. As such, the source line 132 is electrically connected to the source region 142 of the first transistor 140. As illustrated, the MRM structure further includes at least one MRM cell 100 that includes an MRM transistor 102 electrically in series with an MRM magnetic tunnel junction 101. The MRM transistor 102 includes MRM source region 122 and MRM drain region 123. The first transistor 140 is electrically connected to the MRM source region 122 and the MRM MTJ 101 is electrically connected to the MRM drain region 123. The MRM transistor 102 also includes an MRM gate electrode 124. Word line 131 is electrically connected to the MRM gate electrode 124. The MRM MTJ includes a fixed layer 111, a free layer 112, and a tunnel barrier layer 113 between the fixed layer 111 and the free layer 112). Bit line 133 is electrically connected to the MRM MTJ 101 of the MRM cell 100.

While in some embodiments only one MRM cell 100 is provided, in other embodiments an array 105 of MRM cells is provided. This is illustrated in FIG. 2A as MRM cells, 100-1, 100-2, 100-3, and 100-N, in order to convey that any number of MRM cells 100 in an array 105 may be provided. Accordingly, the respective features of each MRM cell 100-1 through 100-N are provided with an appropriate suffix, for example the MTJs 101-1 through 101-N and the MRM transistors 102-1 through 102-N (including source regions 122-1 through 122-N, the drain regions 123-1 through 123-N, gate electrodes 124-1 through 124-N, and associated word lines 131-1 through 131-N). The MRM cells 100-1 through 100-N may be any type of MRM cell, for example STT-MRAM, VCMA-MRAM, or SOT-MRAM, among others.

Each MRM transistor 102-1 through 102-N is electrically connected to the drain region 143 of the first transistor 140 such that each MRM cell 100-1 through 100-N is electrically in series with the first transistor 140. As initially noted, this series combination creates the existence of a resistive series voltage divider. The resistive series voltage divider divides the read voltage applied across the bit line 133 and source line 132, with a first voltage across the first transistor 140 and a second voltage across a respective one of MRM cells 100-1 through 100-N summing to the read voltage. Mid-point node 145 is provided such that each respective MRM cell 100-1 through 100-N can be electrically in series with the first transistor 140 while simultaneously being electrically in parallel with one another. As also initially noted, it is the voltage at a mid-point node 145 that can be used to determine the state of the respective one of MRM cells 100-1 through 100-N.

The MRM structure additionally includes a voltage amplifier 150 that is electrically connected to the drain region 143 of the first transistor 140 via the mid-point node 145 and line 149. A single voltage amplifier may be used for the entire array 105, thus reducing the physical space required to implement the presently described embodiments. In some embodiments, the voltage amplifier 150 may be a complementary metal oxide semiconductor (CMOS) inverter. CMOS inverters are generally known in the art, and include both an N-type MOS (NMOS) and a P-type MOS (PMOS). The outputs of the PMOS and NMOS transistors are complementary such that when the input is low, the output is high, and when the input is high, the output is low. Because of this behavior of input and output, the CMOS circuit's output is the inverse of the input. Thus, as to the present disclosure, a relatively low voltage input will be amplified to a relatively high voltage output. It should be appreciated the CMOS inverters are tunable in the sense that they function best in a "transition" regions of voltages, and as such a CMOS employed as a voltage amplifier 150 in the present disclosure may be tuned such that the expected voltages at the mid-point node 145 fall well within this transition region. Alternatively, in other embodiments, the voltage amplifier may be a metal oxide semiconductor field effect transistor (MOSFET). A MOSFET can amplify the voltage between its source and drain in a tunable manner by appropriate selection of ion-dopant species, dopant concentration, channel length, and other factors well-known in the art. As a further alternative embodiment, one or more cascade inverters may be employed for voltage amplification purposes.

The MRM structure additionally includes a sense amplifier 160 that is electrically connected to the voltage amplifier 150 via line 151, and is configured for sensing the memory state of the respective one of the MRM cells 100-1 through 100-N based on the amplified voltage provided by the voltage amplifier 150. Sense amplifier 160 functions to sense the amplified voltage that represents a data bit (1 or 0) stored in the respective one of the MRM cells 100-1 through 100-N, and further amplify the voltage to recognizable logic levels so the data can be interpreted properly by logic outside the memory (for example as part of the described integrated circuit). In some embodiments, if the output voltage amplified by the voltage amplifier 150 is large enough the subsequent sense amplifier 160 could be embodied as another CMOS inverter. Sense amplifiers are generally known in the art, and may include one or more transistors and/or capacitors in an appropriate arrangement. The voltage amplifier 150 and the sense amplifier 160 may be disposed either outside of the array 105 or as part of the array 105 in order to reduce sensing delays in the case of high-resistance MTJs 101.

Figure 2B:
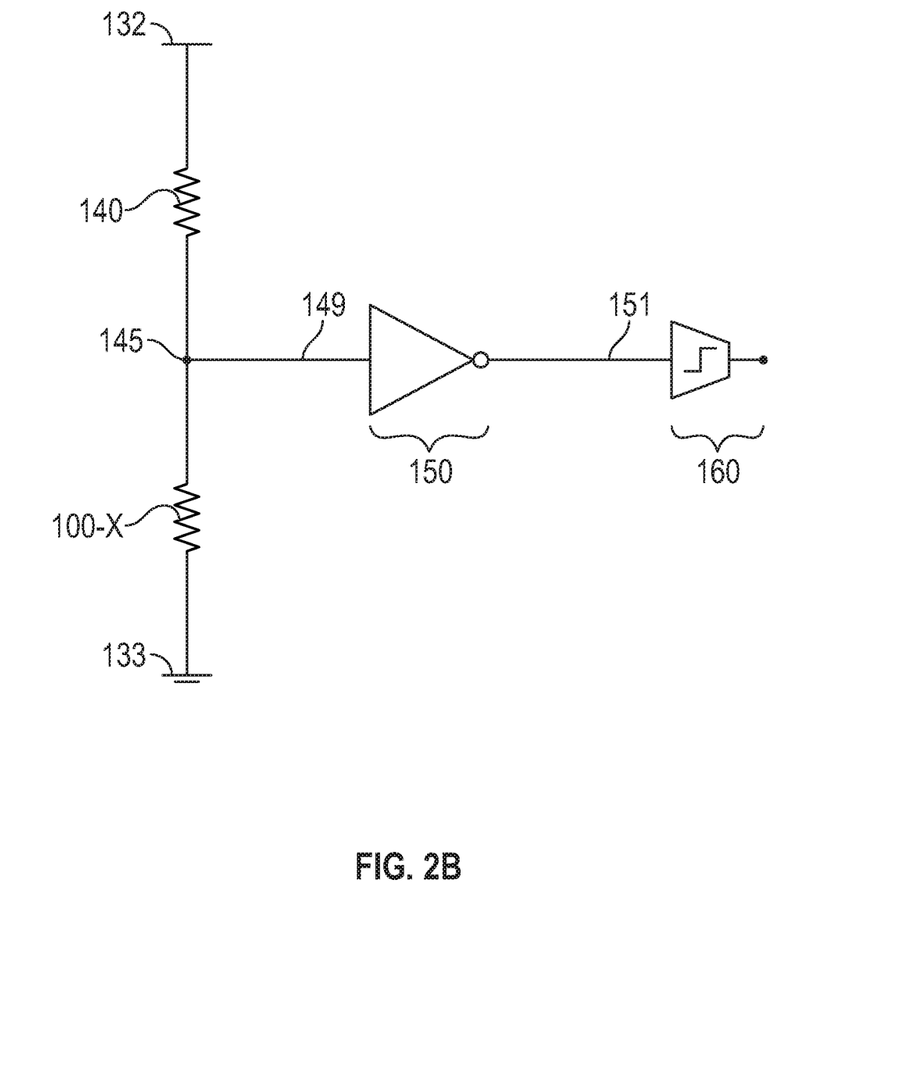
FIG. 2B is a circuit diagram corresponding to the MRM structure design of FIG. 2A.

FIG. 2B is a circuit diagram corresponding to the MRM structure design of FIG. 2A. In particular, FIG. 2B focuses on how the first transistor 140 (having a fixed resistance) in series with the particular MRM cell (designated 100-X, and having a variable resistance) functions as a resistive series voltage divider. At the mid-point node 145, when a voltage is applied from the bit line to the source line, the voltage amplifier 150 functions to amplify the mid-point node 145 voltage, which is then read by the sense amplifier 160 for purposes of determining the memory state of MRM cell 100-X.

Figure 4:
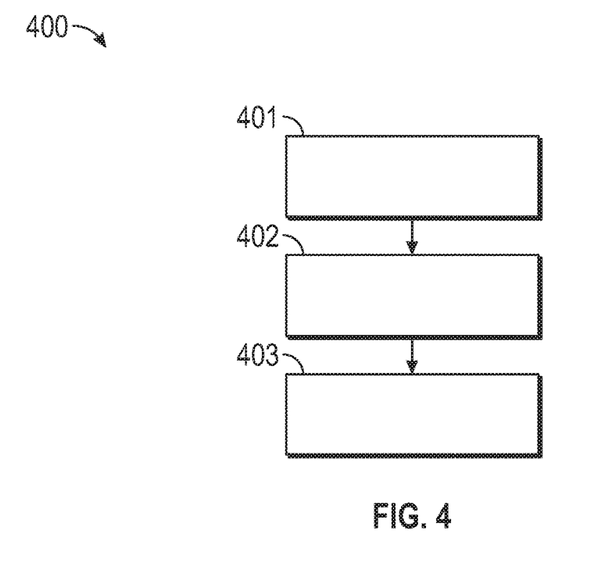
FIG. 4 is a block-and-flow diagram illustrating a method for sensing a memory state of a magneto-resistive memory structure in accordance with various embodiments of the present disclosure.

In accordance with FIGS. 2A and 2B, FIG. 4 is a block-and-flow diagram illustrating a method 400 for sensing a memory state of a magneto-resistive memory structure in accordance with various embodiments of the present disclosure. Method 400 includes a step 401 of generating a voltage across the MRM structure. The MRM structure includes first transistor 140 electrically in series with MRM cell 100. The MRM cell 100 includes MRM transistor 102 and an MRM magnetic tunnel junction 101. A mid-point voltage is thereby generated at mid-point node 145 between the first transistor 140 and the MRM cell 100. The method 400 further includes a step 402 of amplifying the mid-point voltage to generate an amplified voltage and a step 403 of sensing the amplified voltage to determine the memory state of the MRM structure. It should be appreciated that the present recitation of method steps is not intended to exclude other, non-recited steps as may be appropriate in an embodiment.

Figure 3A:
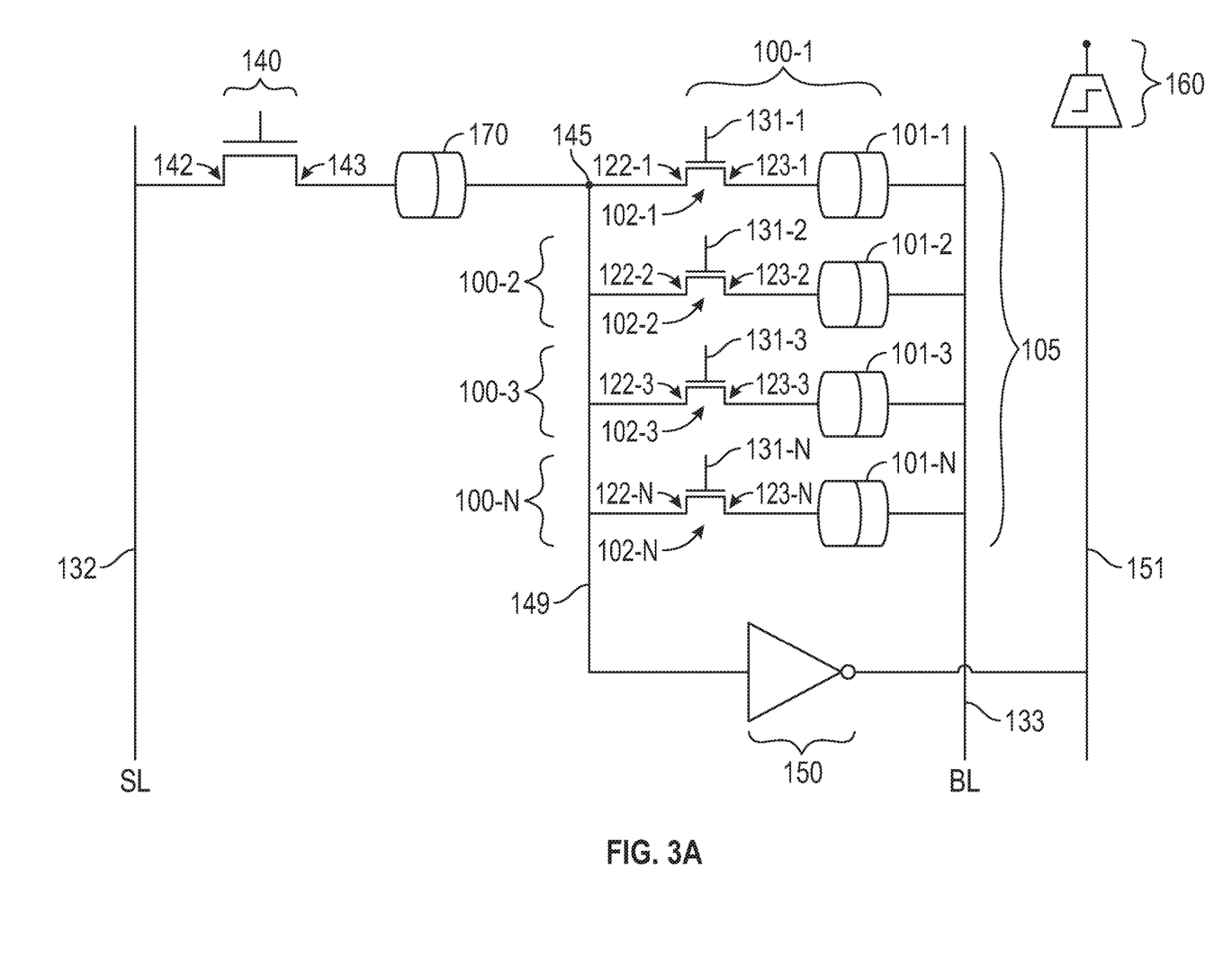
FIG. 3A is a design for an MRM structure in accordance with another embodiment of the present disclosure.

FIG. 3A presents a design for an MRM structure in accordance with an alternative embodiment of the present disclosure. The design of FIG. 3A differs from the design of FIG. 2A in that the design of FIG. 3A includes a reference MTJ 170 electrically in series with the first transistor 140. The reference MTJ 170 is electrically connected to the drain region 143 of the first transistor 140. Moreover, the MRM transistor(s) 102 is electrically connected to the reference MTJ 170 such that the MRM cell(s) 100 is electrically in series with the first transistor 140 and the reference MTJ 170. In particular, the reference MTJ 170 is electrically connected to the MRM source region 122. In this configuration, the first transistor 140 and the reference MTJ 170 in electrical series combination with the MRM cell 100 forms the resistive series voltage divider. The reference MTJ 170 serves as an aide in setting the resistance of the combined first transistor 140/reference MTJ series pairing in order to "tune" the first voltage of the voltage divider such that the mid-point voltage, regardless of MRM cell memory state, is in a more desirable range for a particular application.

Figure 3B:
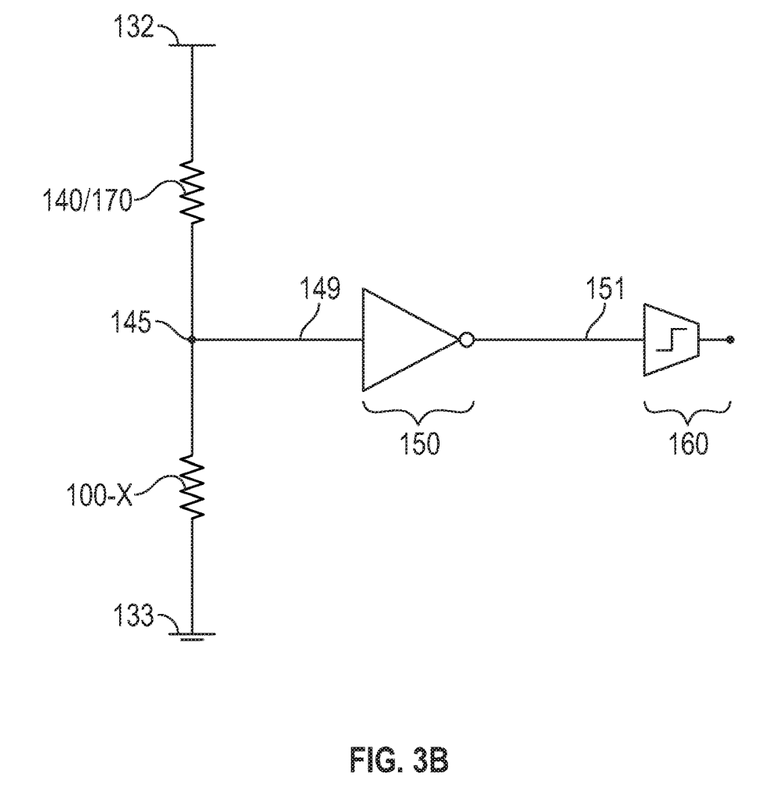
FIG. 3B is a circuit diagram corresponding to the MRM structure design of FIG. 3A.

FIG. 3B is a circuit diagram corresponding to the MRM structure design of FIG. 3A. In particular, FIG. 3B focuses on how the first transistor 140/reference MTJ 170 series pairing (having a tunable, fixed resistance) in series with the particular MRM cell (designated 100-X, and having a variable resistance) functions as a resistive series voltage divider. Thus, at the mid-point node 145, when a voltage is applied from the bit line to the source line, the voltage amplifier 150 functions to amplify the mid-point node 145 voltage (which can be kept within a desired range using the tuning ability of reference MTJ 170), which is then read by the sense amplifier 160 for purposes of determining the memory state of MRM cell 100-X.

Accordingly, the present disclosure has provided embodiments of MRM structures with improved sensing at low read voltages, and associated sensing methods. The disclosed embodiments beneficially provide MRM structures that exhibit a resistive series voltage divider, and utilize amplification of the voltage at a mid-point node of the voltage divider, in order to more accurately sense low read voltages. As such, the presently described embodiments allow for the fabrication of integrated circuits with improved reliability.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A magneto-resistive memory (MRM) structure comprising:
   a source line;

a first transistor comprising a source region and a drain region, wherein the source line is electrically connected to the source region of the first transistor;

an MRM cell comprising an MRM transistor electrically in series with an MRM magnetic tunnel junction (MTJ), wherein the MRM transistor is electrically connected to the drain region of the first transistor such that the MRM cell is electrically in series with the first transistor;

a voltage amplifier electrically connected to a mid-point node of the first transistor and the MRM transistor such that the voltage amplifier amplifies a voltage of the mid-point node, wherein the mid-point node is located between the drain region of the first transistor and the MRM transistor;

a sense-amplifier electrically connected to the voltage amplifier and a logic cell, wherein the sense-amplifier converts the amplified voltage of the mid-point node to a data bit transmitted to the logic cell; and a bit line electrically connected to the MRM MTJ of the MRM cell, wherein the mid-point node is thereby located between the source line and the bit line.

2. The MRM structure of claim 1, additionally comprising a further MRM cell comprising a further MRM transistor electrically in series with a further MTJ, wherein the further MRM transistor is electrically connected to the drain region of the first transistor such that the further MRM cell is electrically in series with the first transistor, wherein the voltage amplifier is additionally electrically in parallel with the further MRM cell, and wherein the bit line is electrically connected to the further MTJ of the further MRM cell.

3. The MRM structure of claim 1, wherein the MRM cell is selected from the group consisting of: a spin torque-transfer magneto-resistive random access memory (STT-MRAM) cell, a voltage-controlled magnetic anisotropy magneto-resistive random access memory (VCMA-MRAM) cell, and a spin orbit torque magneto-resistive random access memory (SOT-MRAM) cell.

4. The MRM structure of claim 1, wherein the voltage amplifier comprises a complementary metal oxide semiconductor (CMOS) inverter.

5. The MRM structure of claim 1, wherein the voltage amplifier comprises a metal oxide semiconductor field effect transistor (MOSFET).

6. The MRM structure of claim 1, wherein the MRM MTJ comprises a fixed layer, a free layer, and a tunnel barrier layer disposed between the fixed layer and the free layer.

7. The MRM structure of claim 1, wherein the MRM transistor comprises an MRM source region and an MRM drain region, and wherein the first transistor is electrically connected to the MRM source region and the MRM MTJ is electrically connected to the MRM drain region.

8. The MRM structure of claim 1, wherein the MRM transistor comprises an MRM gate electrode, and wherein the MRM structure additionally comprises a word line electrically connected to the MRM gate electrode.

9. The MRM structure of claim 1, wherein the first transistor in electrical series combination with the MRM cell forms a resistive series voltage divider.

10. An integrated circuit comprising the MRM structure of claim 1.

11. A magneto-resistive memory (MRM) structure comprising:

a source line;

a first transistor comprising a source region and a drain region, wherein the source line is electrically connected to the source region of the first transistor;

a reference magnetic tunnel junction (MTJ) electrically in series with the first transistor, wherein the reference MTJ is electrically connected to the drain region of the first transistor;

an MRM cell comprising an MRM transistor electrically in series with an MRM MTJ, wherein the MRM transistor is electrically connected to the reference MTJ such that the MRM cell is electrically in series with the first transistor and the reference MTJ;

a voltage amplifier electrically connected to a mid-point node of the first transistor and the MRM transistor such that the voltage amplifier amplifies a voltage of the mid-point node, wherein the mid-point node is located between the reference MTJ and the MRM transistor;

a sense-amplifier electrically connected to the voltage amplifier and a logic cell, wherein the sense-amplifier converts the amplified voltage of the mid-point node to a data bit transmitted to the logic cell; and a bit line electrically connected to the MRM MTJ of the MRM cell, wherein the mid-point node is thereby located between the source line and the bit line.

12. The MRM structure of claim 11, additionally comprising a further MRM cell comprising a further MRM transistor electrically in series with a further MTJ, wherein the further MRM transistor is electrically connected to the reference MTJ such that the further MRM cell is electrically in series with the first transistor and the reference MTJ, wherein the voltage amplifier is additionally electrically in parallel with the further MRM cell, and wherein the bit line is electrically connected to the further MTJ of the further MRM cell.

13. The MRM structure of claim 11, wherein the MRM cell is selected from the group consisting of: a spin torque-transfer magneto-resistive random access memory (STT-MRAM) cell, a voltage-controlled magnetic anisotropy magneto-resistive random access memory (VCMA-MRAM) cell, and a spin orbit torque magneto-resistive random access memory (SOT-MRAM) cell.

14. The MRM structure of claim 11, wherein the voltage amplifier comprises a complementary metal oxide semiconductor (CMOS) inverter.

15. The MRM structure of claim 11, wherein the voltage amplifier comprises a metal oxide semiconductor field effect transistor (MOSFET).

16. The MRM structure of claim 11, wherein the MRM transistor comprises an MRM source region and an MRM drain region, and wherein the reference MTJ is electrically connected to the MRM source region and the MRM MTJ is electrically connected to the MRM drain region.

17. The MRM structure of claim 11, wherein the MRM transistor comprises an MRM gate electrode, and wherein the MRM structure additionally comprises a word line electrically connected to the MRM gate electrode.

18. The MRM structure of claim 11, wherein the first transistor and the reference MTJ in electrical series combination with the MRM cell forms a resistive series voltage divider.

19. An integrated circuit comprising the MRM structure of claim 11.

20. An integrated circuit, comprising:

a source line;

a magneto-resistive memory (MRM) structure including:

a first transistor comprising a source region and a drain region, wherein the source line is electrically connected to the source region of the first transistor;

a plurality of MRM cells each comprising an MRM transistor electrically in series with a respective MRM magnetic tunnel junction (MTJ), wherein each MRM transistor is electrically connected to the drain region of the first transistor such that each MRM cell is electrically in series with the first transistor;

a voltage amplifier electrically connected to a mid-point node of the first transistor and each MRM transistor such that the voltage amplifier amplifies a voltage of the mid-point node, wherein the mid-point node is located between the drain region of the first transistor and each MRM transistor;

a sense-amplifier electrically connected to the voltage amplifier and a logic cell, wherein the sense-amplifier converts the amplified voltage of the mid-point node to a data bit transmitted to the logic cell, wherein the amplified voltage of the mid-point node is less than a write voltage of each of the plurality of MRM cells; and a bit line electrically connected to the MRM MTJ of each MRM cell, wherein the mid-point node is thereby located between the source line and the bit line.

* * * * *